US009947596B2

(12) United States Patent
Kumar Roy et al.

(10) Patent No.: US 9,947,596 B2
(45) Date of Patent: Apr. 17, 2018

(54) RANGE-BASED REAL-TIME SCANNING ELECTRON MICROSCOPE NON-VISUAL BINNER

(71) Applicant: KLA-Tencor Corporation, Milpitas, CA (US)

(72) Inventors: Hemanta Kumar Roy, Bardhaman (IN); Arpit Jain, Indore (IN); Arpit Yati, Lucknow (IN); Olivier Moreau, Sunnyvale, CA (US); Arun Lobo, Mangalore (IN)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/227,698

(22) Filed: Aug. 3, 2016

(65) Prior Publication Data

US 2017/0040142 A1    Feb. 9, 2017

Related U.S. Application Data

(60) Provisional application No. 62/222,647, filed on Sep. 23, 2015.

(30) Foreign Application Priority Data

Aug. 5, 2015    (IN) ............................ 4069/CHE/2015

(51) Int. Cl.
*H01J 37/22*    (2006.01)
*H01J 37/28*    (2006.01)
(Continued)

(52) U.S. Cl.
CPC .... *H01L 22/00* (2013.01); *H01J 2237/24571* (2013.01); *H01J 2237/24592* (2013.01); *H01J 2237/2817* (2013.01)

(58) Field of Classification Search
CPC ......... H01J 37/06; H01J 37/263; H01J 37/268
(Continued)

(56) References Cited

U.S. PATENT DOCUMENTS 6,200,823 B1    3/2001   Steffan et al.
7,466,853 B2    12/2008  Kim et al.
(Continued)

FOREIGN PATENT DOCUMENTS

JP    2001210689    8/2001
JP    2005032760    2/2005
(Continued)

OTHER PUBLICATIONS

Frontiers of Characterization and Metrology for Nanoelectronics, Final Program and Abstracts, 2009 International Conference, May 11-14, 2009, http://www.nist.gov/pml/div683/conference/upload/full_program_download.pdf.
(Continued)

*Primary Examiner* — Nicole Ippolito
(74) *Attorney, Agent, or Firm* — Hodgson Russ LLP (57) ABSTRACT

A technique to identify non-visual defects, such as SEM non-visual defects (SNVs), includes generating an image of a layer of a wafer, evaluating at least one attribute of the image using a classifier, and identifying the non-visual defects on the layer of the wafer. A controller can be configured to identify the non-visual defects using the classifier. This controller can communicate with a defect review tool, such as a scanning electron microscope (SEM).

16 Claims, 4 Drawing Sheets

(51) Int. Cl.
*H01J 37/20* (2006.01)
*H01L 21/66* (2006.01)

(58) Field of Classification Search
USPC .................. 250/306, 307, 309, 310, 311
See application file for complete search history.

(56) References Cited

U.S. PATENT DOCUMENTS

| | | | |
|---|---|---|---|
| 8,489,945 B2 | 7/2013 | Mai et al. | |
| 8,716,662 B1* | 5/2014 | MacDonald | H01J 37/222 250/307 |
| 2004/0207415 A1 | 10/2004 | Yamada et al. | |
| 2005/0087686 A1* | 4/2005 | Honda | G01N 23/2251 250/307 |
| 2014/0270474 A1 | 9/2014 | Huang et al. | |
| 2017/0082555 A1 | 3/2017 | He et al. | |

FOREIGN PATENT DOCUMENTS

| | | |
|---|---|---|
| WO | 2008053524 | 5/2008 |
| WO | 2014074910 A1 | 5/2014 |

OTHER PUBLICATIONS

Howland et al., Process Watch: The dangerous disappearing defect, Solid State Technology, May 29, 2012, http://electroiq.com/blog/2012/05/process-watch-the-dangerous-disappearing-defect/.
Yield Management Solutions, KLA-Tencor's YMS Magazine, 2008, Issue 1, https://issuu.com/kla-tencor/docs/spring08_yms08_issue1_2e4e889cb806d5.
Danel et al., Surface Potential Difference Imaging Applied to Wet Clean Monitoring, Solid State Phenomena, vols. 145-146, Jan. 6, 2009, pp. 109-112.
Yield Enhancement, International Technology Roadmap for Semiconductors, 2007 Edition.
Scranton et al., Full-wafer post-via wet clean nonvisual defect inspection, Solid State Technology, Apr. 2008, pp. 32-35.
ISA/KR, International Search Report for PCT/US2016/045410 dated Oct. 12, 2016.

\* cited by examiner

RANGE-BASED REAL-TIME SCANNING ELECTRON MICROSCOPE NON-VISUAL BINNER

CROSS-REFERENCE TO RELATED APPLICATIONS

This application claims priority to the Indian provisional patent application filed Aug. 5, 2015 and assigned Indian App. No. 4069/CHE/2015 and to the provisional patent application filed Sep. 23, 2015 and assigned U.S. App. No. 62/222,647, the disclosures of which are hereby incorporated by reference.

FIELD OF THE DISCLOSURE

This disclosure relates to classification of defects and, more particularly, to classification of non-visual defects.

BACKGROUND OF THE DISCLOSURE

Wafer inspection systems help a semiconductor manufacturer increase and maintain integrated circuit (IC) chip yields by detecting defects that occur during the manufacturing process. One purpose of inspection systems is to monitor whether a manufacturing process meets specifications. The inspection system indicates the problem and/or the source of the problem if the manufacturing process is outside the scope of established norms, which the semiconductor manufacturer can then address.

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

Previous techniques for classification of defects, including manual classification and layer-based automatic classification, involve too much time and effort. As devices become more complex, manual classification of defects in semiconductor fabrication facilities requires increasing time and effort. Even after investing significant time for classification, defect classification can be inaccurate and inconsistent due to human errors. Current techniques of auto-classification of defects in field require many examples of defects and sometimes also human resources for training the classifiers. Furthermore, training the classifier for each defect type for every layer can be cumbersome, as a total number of classifiers to be trained will be the number of defect types times the number of layers.

Manual classification involves manual observation of each defect image with multiple perspectives, defect identification with a known set of reference defect images, and manual allocation of class codes for each defect site. Manual classification of defects requires significant time to complete. This, in turn, is very expensive. Furthermore, use of human judgment during classification can introduce inaccuracies and inconsistencies in the results.

Layer-based automatic classification includes custom classifiers separating all of the critical defect types present that are created for each layer. Classifiers can be created either manually or automatically. Layer-based automatic classification implements creation of layer-specific custom classifiers. The training of classifiers for all the layers requires extensive resources like training data, human resources, and time. For example, training of a classifier for each layer requires training data. The training data should have enough defect examples for each critical defect required to be classified by the classifier. Some classifier creation schemes being used in the field require manual classifier creation. Along with involving significant time investment, this also brings in the inconsistency in performance of created classifiers due to inaccuracy in judging the best set of attributes for creating those classifiers. Large amounts of time are spent on creating, training, and maintaining the classifiers with huge repetitions in their creation for same defect types across layers at a particular site and also across multiple customer sites.

Therefore, what is needed is a system and technique that reduces time and effort required to classify wafer defects.

BRIEF SUMMARY OF THE DISCLOSURE

In a first embodiment, a system is provided. The system comprises a defect review tool and a controller configured to communicate with the defect review tool. The defect review tool has a stage configured to clamp a wafer. The controller is configured to identify a non-visual defect on a layer of the wafer using a classifier. The defect review tool can be a scanning electron microscope (SEM). The non-visual defect can be an SEM non-visual defect (SNV).

The controller can comprise a processor configured to communicate with the defect review tool, a storage device in electronic communication with the processor containing the classifier, and a communication port in electronic communication with the processor for communicating with the defect review tool.

The controller can identify a non-visual defect by using the classifier to filter at least one of topographical defects, intensity attributes, or energy attributes.

In a second embodiment, a method is provided. The method comprises generating, using a defect review tool, an image of a layer on a wafer; evaluating, using a processor, at least one attribute of the image using a classifier; and identifying, using the processor, a non-visual defect on the layer of the wafer using the classifier.

The method may further comprise defining, using the processor, an upper limit and lower limit for non-visual defects, wherein the non-visual defect that is identified is between the upper limit and the lower limit.

The classifier may be configured to filter topographical defects, intensity attributes, and/or energy attributes.

The classifier may be configured to be used on each layer of the wafer.

The generating can use a scanning electron microscope (SEM). The non-visual defect may be an SEM non-visual defect (SNV).

The comparing and identifying may be performed in real-time with the generating.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Scanning electron microscope (SEM) non-visuals (referred to as "SNVs") are defined as review sites which are defective, but do not contain any real defined defects. A real defined defect can be a disruption on the wafer compared to a reference. For example, a real defined defect can be a particle, a scratch, or a void. Thus, SNVs will have similar properties as compared to their reference sites, which can make SNVs difficult to identify manually. As disclosed herein, defect attributes can be calculated after subtracting the reference image from a defect image (i.e., the defect-reference image). This leads to common attribute values of SNVs across layers and creation of a single classifier to bin out SNVs on multiple layers, or a real-time SNV (RT-SNV) classifier. Binning refers to one or more methods to group a number of generally continuous values into a smaller number of sub-groups. A classifier may "bin out" SNVs by identifying cohorts of SNVs for a particular purpose (e.g., defect classification and detection).

Non-visual defects, such as SNVs, can cause electrical failure of a device even though there is no physical remnant or visible defect that can be easily viewed. Examples of non-visual defects include cross-wafer or cross-chip variations in resistance, capacitance, or timing; stress-caused dislocations; localized crystalline defects; or localized bonding defects. Non-visual defects affect yield, which make them a concern to semiconductor manufacturers, and are challenging to identify.

Some defect types, like SNVs or particles, are common and consistent across multiple layers of one or more wafers. This has led to the transition from layer-based classifier creation to defect-based classifier creation. Defect-based classifier creation involves implementation of single classifiers binning out a common defect type across multiple layers of one or more wafers. The common defect types have similar ranges of defect attribute values across multiple layers.

SNVs can be found while reviewing defect maps from all the inspectors. Inspectors may include automated, semi-automated, and manual wafer inspection tools and processes. A semiconductor manufacturer may not want to miss any real defects, which leads to inspection scanning with lower thresholds. In turn, lower thresholds lead to false positives and other nuisances. Separating these false positives or other nuisances from the real defects after review is a daunting task because layers with a high SNV percentage will require extensive time and manpower for review. Embodiments of this disclosure involve attribute ranges for SNVs on multiple layers of one or more wafers to create one classifier to separate SNVs from real defects across all layers and all nodes found in all sites.

As disclosed herein, attribute ranges of SNVs on multiple layers can be used to 1) understand the physical properties of SNVs across a large number of layers, which will enable programmatic separation of the SNVs from other real defects; and 2) to understand the attributes and the ranges of which are the same for SNVs across a large number of layers so that these can be used to programmatically separate out the SNVs. The presently disclosed systems and methods also generate and use a classifier using common attribute ranges for SNVs on all layers to bin out SNVs. The presently disclosed systems and methods also can generate and use a single classifier to bin out SNVs across all layers for different instances such as chain test, discovery flow, etc. Furthermore, this disclosure can use a common (i.e., shared) range across multiple layers of attributes to define cutoffs for the classifier.

RT-SNV classifiers can reduce costs and increase throughput at a semiconductor manufacturer. Moreover, faster classification of defects can help semiconductor manufacturers solve their yield issues faster, which reduces time to results. These benefits result in large capital savings to semiconductor manufacturers.

Figure 1:
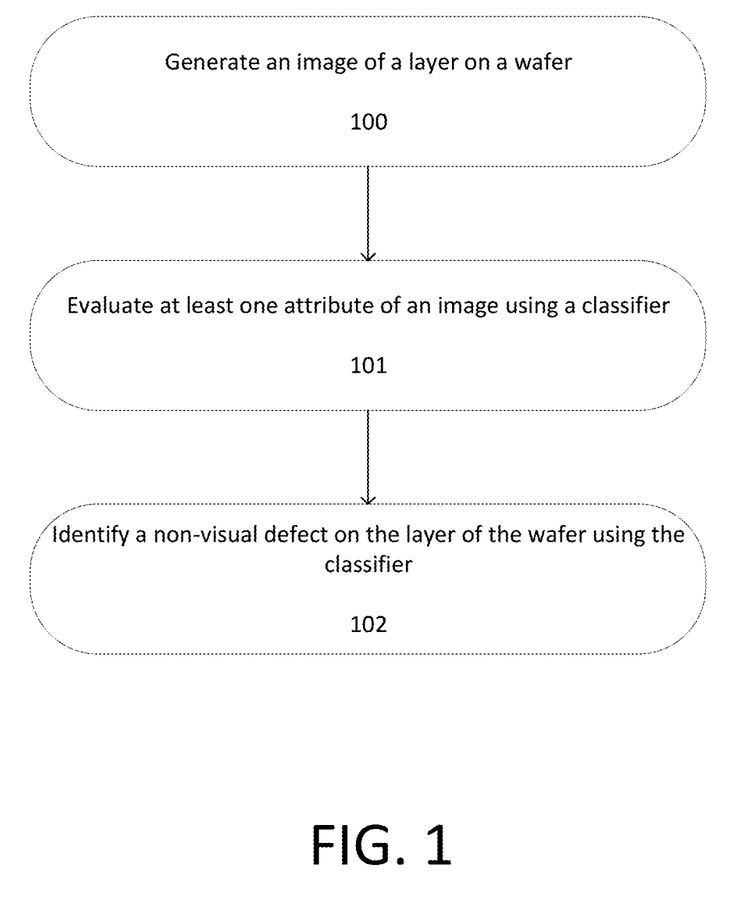
FIG. 1 is a flowchart in accordance of an embodiment of this disclosure.

FIG. 1 is a flowchart in accordance of an embodiment of this disclosure. Each of the steps of the method may be performed as described further herein. The method may also include any other step(s) that can be performed by the image acquisition subsystem and/or computer subsystem(s) or system(s) described herein. The steps are performed by one or more computer systems, which may be configured according to any of the embodiments described herein. In addition, the method described above may be performed by any of the system embodiments described herein.

As seen in FIG. 1, an image of a layer on a wafer is generated at 100. The image may be generated or captured using an image capture device, such as a scanning electron microscope (SEM). The image may comprise one or more images that have been stitched together programmatically. An image may contain multiple views of a wafer, for example views generated using various wavelengths of light. The image may be digitized and stored into temporary memory (RAM) or permanent memory (such as a hard drive). The image may be stored in a curated database accessible to one or more systems via the Internet or intranet. At least one attribute of the image is evaluated using a classifier at 101. For example, the image may be retrieved by a classification processor for evaluation. The classification processor may request the image from temporary memory or permanent memory. In one embodiment, the classification processor may request the image from the curated database. The classification processor may evaluate the image using a classifier. As such, non-visual defects, such as SNVs, on the layer of the wafer are identified using the classifier at 102.

The classifier can be created or generated based on defect attributes that are extracted on SEM review images across multiple layers and/or multiple wafers (and across multiple sites, using assorted equipment). This may be performed with inspection or metrology algorithms. Collected SEM review images may be manually classified into different types of defects and SNVs. In some embodiments, collected SEM review images may be imported from previous testing and known sources.

Figure 2:
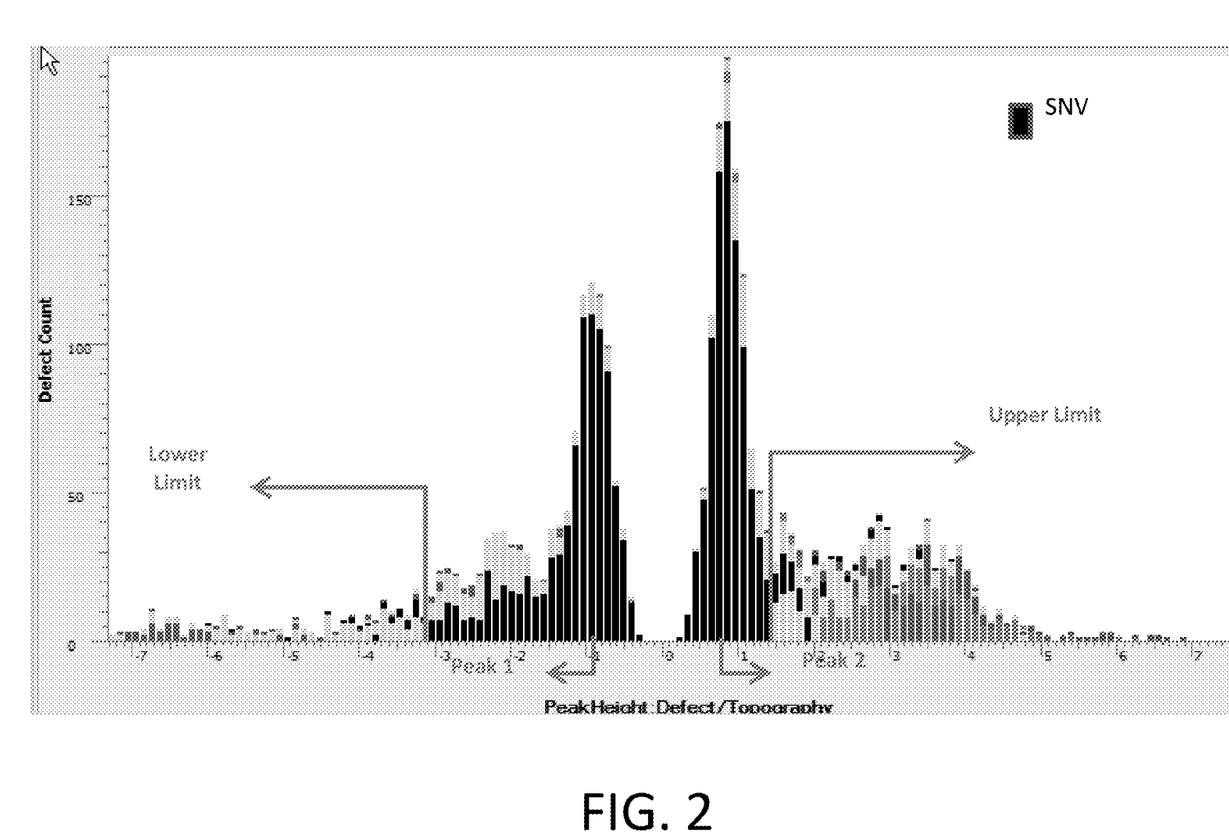
FIG. 2 is a chart showing exemplary upper and lower limits for scanning electron microscope non-visual (SNV) spread.

Defect review and classification software, such as Impact XP from KLA-Tencor Corporation, is used to determine the range of attribute values for SNVs. This defect review and classification software may include automatic defect classification. Upper and lower limits for SNV spread for a particular attribute are generated at the boundaries within which a majority of SNVs (excluding outliers) are present together. For example, see the upper and lower limits in FIG. 2. The spread of attribute values of a majority of SNVs lies within a range around the ideal values of SNVs. For example, for SNVs, Attribute1=1, Attribute2=0, Attribute3=0, etc.

Similar data is collected for multiple layers on various review lots to determine or further analyze attributes which are useful to define and classify SNVs. SNV range data (including upper and lower limits) may be collected for multiple attributes. Different imaging conditions can be used across different layers and/or different wafers.

Attribute range values for SNVs are programmatically analyzed for common ranges across layers of one or more wafers. As attributes may show common range of values for SNVs across layers, common attribute ranges for SNVs may be used for implementation of a single classifier to bin out SNVs across multiple layers. These common ranges will be used to define the attribute boundaries for RT-SNV classifier. The performance of RT-SNV classifier thus formed is verified across multiple wafers.

A variety of attributes can be used to filter different types of defects from SNV bins using a classifier. These include some or all of the following filters. Topography attributes filter out topographical defects like particles, scratches, etc. Intensity attributes separate high material contrast or high GL difference defects like residues, scum, etc. Energy attributes filter high energy and high energy density defects like voids or large defects. Similarly, other types of attributes can be used to separate different types of defects from SNVs.

Extracted attribute ranges can be plotted. The real-time automatic defect classification (RT-ADC) attributes mentioned below, ranges for SNVs are similar for a large variety of layers.

Figure 3:
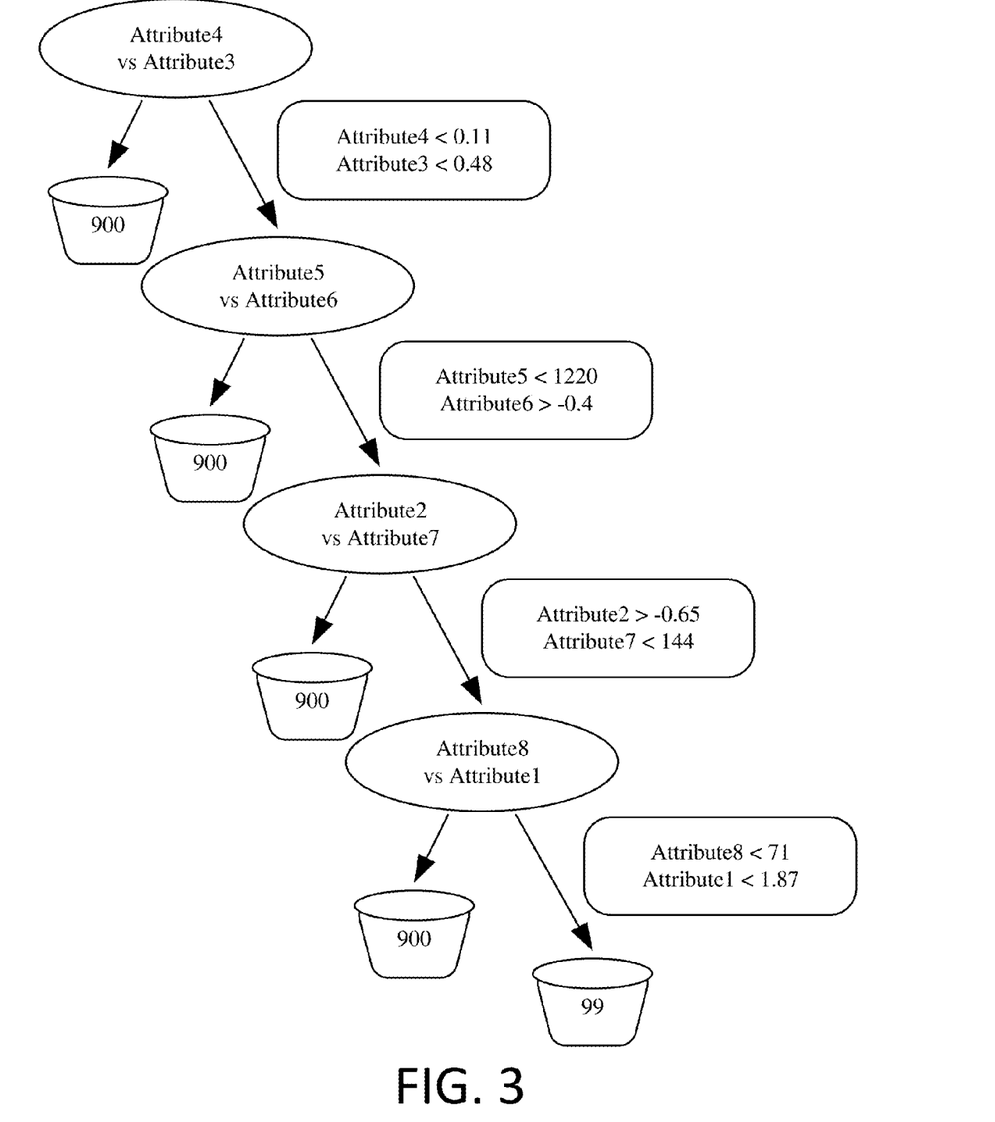
FIG. 3 is a schematic of an exemplary SNV classifier.

For example, see FIG. 3 for an exemplary SNV classifier.

After the classifier is readied, it can be deployed to identify SNVs on layers of other wafers.

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

Figure 4:
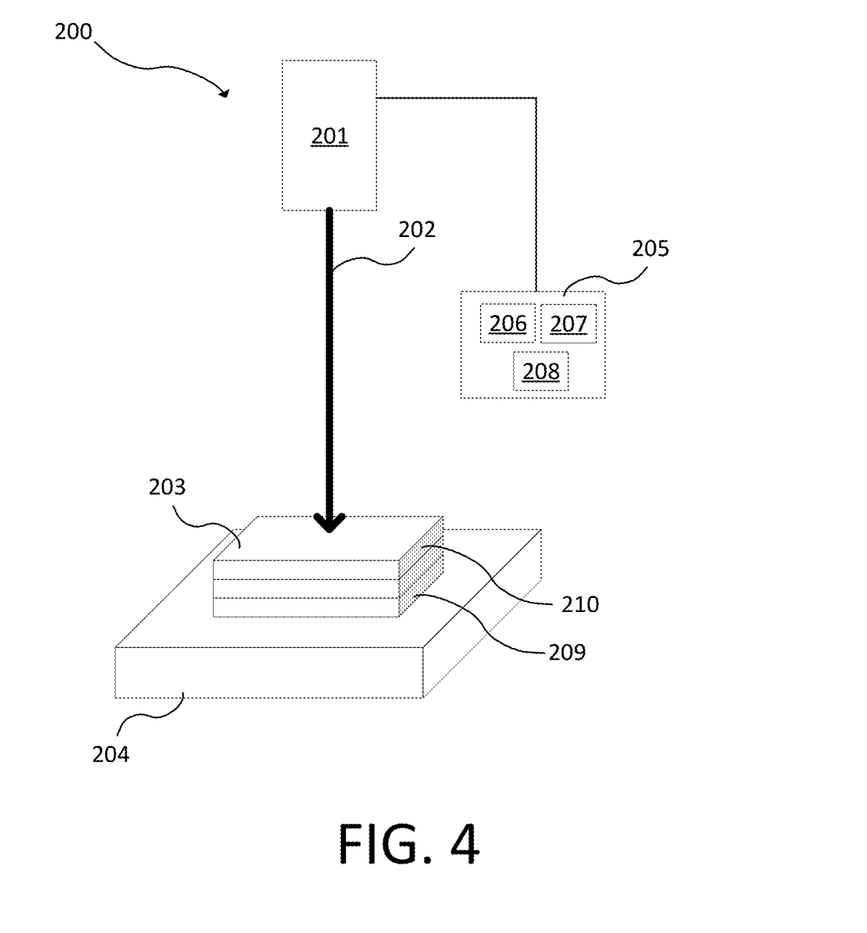
FIG. 4 is an embodiment of a defect review tool in accordance with the present disclosure.

FIG. 4 is an embodiment of a defect review tool 200. The defect review tool 200 may be a SEM, another defect review tool that uses an electron beam, or other equipment configured to inspect wafers.

The defect review tool 200 includes a stage 204 configured to clamp a wafer 203. The stage 204 may be configured to move or rotate in one, two, or three axes.

TABLE 1

| | Attribute3 | Attribute4 | Attribute5 | Attribute6 | Attribute2 | Attribute7 | Attribute8 | Attribute1 |
|---|---|---|---|---|---|---|---|---|
| Lower Limit | 0.1 | 0 | 38 | −0.4 | −0.6 | 40 | 13 | 1 |
| Upper Limit | 0.48 | 0.12 | 1225 | 0 | 0.45 | 145 | 70 | 1.75 |

The boundaries of common attribute ranges for SNVs on all layers may be used as cutoffs of respective attribute nodes for the classifier. No conventional training of the classifier may be required after this and the classifier should be ready for deployment in any layer of any node in any customer site. However, in some embodiments, cutoffs may need to be adjusted away from the common attribute ranges in order to compensate for particular instruments or purposes.

Nodes for the following attributes may be used by the classifier for separating SNVs from real defects. Attribute2, Attribute3, Attribute6, and Attribute5 separate the topographical real defects like particles and scratches from SNVs. Attribute5 may, for example, involve energy measurements. Attribute2 may, for example, compare peak heights. Attribute3 and Attribute6 may be positive and negative measurements, respectively. Attribute7 separates the high material contrast real defects like residues from SNVs. Attribute8 separates the high density real defects like voids from SNVs. Attribute4 can cover saliency and can separates the unique single defects like a hump, small particle, small pit, and open from the SNVs. Attribute1 separates any other defect that is not similar to background from SNVs.

As seen in FIG. 4, the wafer 203 includes multiple layers, including layers 209 and 210. The layer 210 is formed after the layer 209. While the layer 210 is illustrated as being imaged in FIG. 4, the layer 209 may have been imaged prior to formation of the layer 210. More or fewer layers are possible than the three layers illustrated in FIG. 4.

The defect review tool 200 also includes an image generation system 201 configured to generate an image of a surface of the wafer 203. The image may be for a particular layer of the wafer 203. In this example, the image generation system 201 produces an electron beam 202 to generate an image of the wafer 203. Other image generation systems 201 are possible, such as those that use broad band plasma or laser scanning.

In a particular example, the defect review tool 200 is part of or is a scanning electron microscope (SEM). Images of the wafer 203 are generated by scanning the wafer 203 with a focused electron beam 202. The electrons are used to produce signals that contain information about the surface topography and composition of the wafer 203. The electron beam 202 can be scanned in a raster scan pattern, and the position of the electron beam 202 can be combined with the detected signal to produce an image.

The defect review tool 200 communicates with a controller 205. For example, the controller 205 can communicate with the image generation system 201 or other components of the defect review tool 200. The controller 205 can include a processor 206, a storage device 207 in electronic communication with the processor 206, and a communication port 208 in electronic communication with the processor 206. It is to be appreciated that the controller 205 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 205 to implement the various methods and functions described herein may be stored in controller readable storage media, such as a memory, within the controller 105, external to the controller 205, or combinations thereof.

The controller 205 also may identify a non-visual defect, such as an SNV, on a layer of the wafer using a classifier. For example, the controller 205 may perform the steps of FIG. 1. The controller 205 also may perform other steps or techniques disclosed herein.

The controller 205 may be coupled to the detectors of the defect review tool 200 in any suitable manner (e.g., via one or more transmission media, which may include "wired" and/or "wireless" transmission media) such that the controller 205 can receive the output generated by the detectors, such as those in the image generation system 201. The controller 205 may be configured to perform a number of functions using the output of the detectors. For instance, the controller 205 may be configured to detect defects on the wafer 203 using the output of the detectors. Detecting the defects on the wafer 203 may be performed by the controller 205 by applying some defect detection algorithm and/or method to the output generated by the detectors. The defect detection algorithm and/or method may include any suitable algorithm and/or method disclosed herein or known in the art. For example, the controller 205 may compare the output of the detectors to a threshold. Any output having values above the threshold may be identified as a potential defect, such as an SNV or other non-visual defect, while any output having values below the threshold may not be identified as a potential defect. In another example, the controller 205 may be configured to send the output of the detectors to a storage device 207 or another storage medium without performing defect detection on the output. The controller 205 may be further configured as described herein.

The controller 205, other system(s), or other subsystem(s) described herein may take various forms, including a personal computer system, image computer, mainframe computer system, workstation, network appliance, internet appliance, or other device. In general, the term "controller" may be broadly defined to encompass any device having one or more processors, which executes instructions from a memory medium. The subsystem(s) or system(s) may also include any suitable processor known in the art such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a controller for performing a computer-implemented method for identifying non-visual defects, such as SNVs, as disclosed herein. In particular, as shown in FIG. 4, storage device 207 or other storage medium may contain non-transitory computer-readable medium that includes program instructions executable on the controller 205. The computer-implemented method may include any step(s) of any method(s) described herein.

Program instructions implementing methods such as those described herein may be stored on computer-readable medium, such as in the storage device 207 or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Controller 205 may be configured according to any of the embodiments described herein. Other configurations or functions of the controller 205 are possible, such as those described in U.S. application Ser. No. 14/991,901, the disclosure of which is incorporated by reference in its entirety.

While disclosed as part of a defect review system, the controller described herein may be configured for use with inspection systems. In another embodiment, the controller described herein may be configured for use with a metrology system. Thus, the embodiments of as disclosed herein describe some configurations for classification that can be tailored in a number of manners for systems having different imaging capabilities that are more or less suitable for different applications.

The embodiments disclosed herein also may be configured for inspection, defect review, and metrology of other specimens, such as reticles. For example, the embodiments described herein may be configured for the purposes of mask inspection, wafer inspection, and wafer metrology. In particular, the embodiments described herein may be installed on a computer node or computer cluster that is a component of or coupled to an output acquisition subsystem such as a broadband plasma inspector, an electron beam inspector or defect review tool, a mask inspector, a virtual inspector, etc. In this manner, the embodiments described herein may generate output that can be used for a variety of applications that include, but are not limited to, wafer inspection, mask inspection, electron beam inspection and review, metrology, etc. The controller can be modified as described above based on the specimen for which it will generate actual output.

The embodiments disclosed herein have advantages over manual classification. RT-SNV assists the manual classification of defects. It automatically filters the SNVs using RT-ADC attributes. It reduces defect classification effort and time. It also reduces the human errors present in manual classification method.

The embodiments disclosed herein also have advantages over layer-based automatic classification. Generic defect based classifiers can be used across all layers, while layer-based classifiers work on individual layers only. The RT-SNV classifier saves time spent creating a different SNV classifier on each layer. An RT-SNV classifier can require less training data as compared to layer-based classifiers where training data is required for each layer. The RT-SNV classifier is ready to use, gives consistent results, and does not need any training whereas layer-based classifiers need to be retuned, such as when new lots with different defect types or process variation are encountered.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
a defect review tool, wherein the defect review tool has a stage configured to clamp a wafer; and
a controller configured to communicate with the defect review tool, wherein the controller is configured to identify a non-visual defect on a layer of the wafer using a classifier, wherein the controller identifies the non-visual defect by using the classifier to filter at least one of topographical defects, intensity attributes, or energy attributes, wherein the topographical defects include a particle or a scratch, wherein the intensity attributes include a residue or a scum, and wherein the energy attributes include a void.

2. The system of claim 1, wherein the controller comprises a processor configured to communicate with the defect review tool, a storage device in electronic communication with the processor containing the classifier, and a communication port in electronic communication with the processor for communicating with the defect review tool.

3. The system of claim 1, wherein the defect review tool is a scanning electron microscope (SEM).

4. The system of claim 1, wherein the non-visual defect is an SEM non-visual defect (SNV).

5. The system of claim 1, wherein the classifier is configured to filter the topographical defects.

6. The system of claim 1, wherein the classifier is configured to filter the intensity attributes.

7. The system of claim 1, wherein the classifier is configured to filter the energy attributes.

8. A method comprising:
generating, using a defect review tool, an image of a layer on a wafer;
evaluating, using a processor, at least one attribute of the image using a classifier; and
identifying, using the processor, a non-visual defect on the layer of the wafer using the classifier, wherein the processor identifies the non-visual defect by using the classifier to filter at least one of topographical defects, intensity attributes, or energy attributes, wherein the topographical defects include a particle or a scratch, wherein the intensity attributes include a residue or a scum, and wherein the energy attributes include a void.

9. The method of claim 8, further comprising defining, using the processor, an upper limit and lower limit for non-visual defects, wherein the non-visual defect that is identified is between the upper limit and the lower limit.

10. The method of claim 8, wherein the classifier filters the topographical defects.

11. The method of claim 8, wherein the classifier filters the intensity attributes.

12. The method of claim 8, wherein the classifier filters the energy attributes.

13. The method of claim 8, wherein the classifier is configured to be used on each layer of the wafer.

14. The method of claim 8, wherein the generating uses a scanning electron microscope (SEM).

15. The method of claim 8, wherein the non-visual defect is an SEM non-visual defect (SNV).

16. The method of claim 8, wherein the comparing and identifying may be performed in real-time with the generating.

* * * * *